United States Patent [19]

Pla et al.

[11] Patent Number: 5,458,222
[45] Date of Patent: Oct. 17, 1995

[54] ACTIVE VIBRATION CONTROL OF STRUCTURES UNDERGOING BENDING VIBRATIONS

[75] Inventors: Frederic G. Pla; Harindra Rajiyah, both of Clifton Park, N.Y.

[73] Assignee: General Electric Company, Schenectady, N.Y.

[21] Appl. No.: 349,588

[22] Filed: Dec. 5, 1994

[51] Int. Cl.$^6$ ........................................ F16F 7/10
[52] U.S. Cl. .................. 188/378; 267/136; 324/318
[58] Field of Search ....................... 188/378, 379, 188/380; 248/550; 267/136; 324/318, 319, 300, 320; 415/118, 119; 381/71; 244/1 N

[56] References Cited

U.S. PATENT DOCUMENTS

| | | |
|---|---|---|
| 1,688,743 | 10/1928 | Nicolson . |
| 4,083,433 | 4/1978 | Geohegan, Jr. et al. ............... 188/378 |
| 4,470,121 | 9/1984 | Ebert ........................................ 188/378 |
| 4,551,849 | 11/1985 | Kasai et al. . |
| 4,700,177 | 10/1987 | Nakashima et al. . |
| 4,715,559 | 12/1987 | Fuller . |
| 4,751,419 | 6/1988 | Takahata . |
| 4,795,123 | 1/1989 | Forward et al. ......................... 188/378 |
| 4,947,434 | 8/1990 | Ito . |
| 5,031,222 | 7/1991 | Takaya . |
| 5,235,283 | 8/1993 | Lehne et al. ............................ 324/318 |
| 5,236,186 | 8/1993 | Weltin et al. ....................... 188/378 X |
| 5,331,281 | 7/1994 | Otsuka .................................... 324/318 |
| 5,345,177 | 9/1994 | Sato et al. .............................. 324/318 |
| 5,370,340 | 12/1994 | Pla . |
| 5,382,134 | 1/1995 | Pla et al. ................................. 415/119 |
| 5,391,053 | 2/1995 | Pla et al. ................................. 415/119 |

FOREIGN PATENT DOCUMENTS 2124598  5/1990  Japan .

*Primary Examiner*—Douglas C. Butler
*Attorney, Agent, or Firm*—Douglas E. Erickson; Paul R. Webb, II

[57] ABSTRACT

An active vibration control subassembly for a structure (such as a jet engine duct or a washing machine panel) undergoing bending vibrations caused by a source (such as the clothes agitator of the washing machine) independent of the subassembly. A piezoceramic actuator plate is vibratable by an applied electric AC signal. The plate is connected to the structure such that vibrations in the plate induced by the AC signal cause canceling bending vibrations in the structure and such that the plate is compressively pre-stressed along the structure when the structure is free of any bending vibrations. The compressive prestressing increases the amplitude of the canceling bending vibrations before the critical tensile stress level of the plate is reached. Preferably, a positive electric DC bias is also applied to the plate in its poling direction.

10 Claims, 1 Drawing Sheet

ACTIVE VIBRATION CONTROL OF STRUCTURES UNDERGOING BENDING VIBRATIONS

This invention described herein was made in the performance of work under NASA Contract No. NAS3-26617 and is subject to the provisions of Section 305 of the National Aeronautics and Space Act of 1958 (42 U.S.C. 2457).

BACKGROUND OF THE INVENTION

The present invention relates generally to reducing bending vibrations in a structure, and more particularly to an active vibration control subassembly capable of generating canceling vibrations in the structure to offset such bending vibrations.

Structures which undergo bending vibrations from a source include, but are not limited to, annularly-cylindrical shaped superconductive coils of magnetic resonance imaging (MRI) superconducting magnets, patient positioning tables of X-ray machines, ducts of aircraft engines, and panels of household washing machines. For example, the annularly-cylindrical shaped superconductive coils of a medical MRI superconducting magnet undergo bending vibrations induced by electromagnetic forces generated during magnet operation. The bending vibrations of the superconductive coils cause blurry MRI images which are undesirable since sharp MRI images are needed for accurate medical diagnosis.

Known passive vibration control techniques for reducing bending vibrations in a structure include making the structure thicker, making the structure with stiffening ribs, and adding weights or damping at discrete locations to dampen troublesome vibrations modes. However, adding thickness, ribs, weights, or damping makes the structure more bulky in applications where increasing the weight of the structure is undesirable, such as in aircraft engines.

Known active vibration control techniques for reducing bending vibrations in a structure basically sense the motion of the structure with accelerometers and the like, then calculate the bending vibrations from the sensed motion using a computer or other controller, and then produce canceling bending vibrations generally equal in amplitude and opposite in phase to the calculated bending vibrations. Conventional techniques for generating the canceling bending vibrations include using piezoceramic actuator plates to bendably vibrate the structure to produce the canceling bending vibrations. The piezoceramic plate is driven by an electric AC signal such that when the signal is positive, the plate causes the structure to bendably deflect in a first direction from its resting state, and when the signal is negative, the plate causes the structure to bendably deflect in the opposite direction.

The larger the amplitude of the electric AC signal driving the piezoceramic actuator plate, the larger the canceling bending vibration produced in the attached structure. However, the piezoceramic actuator plate will structurally fail when the applied electric AC signal causes the plate to exceed its critical tensile stress (which is smaller than its critical compressive stress). It is noted that the particular value of the critical tensile (or compressive) stress depends on the particular piezoceramic material being used. What is needed is an improved subassembly, of an active vibration control system, for generating large canceling bending vibrations to reduce the bending vibrations produced in a structure by a source independent of the subassembly.

SUMMARY OF THE INVENTION

It is an object of the invention to provide an active vibration control subassembly for a structure, wherein the subassembly is capable of generating canceling bending vibrations required by an active vibration control system for reducing bending vibrations produced in the structure by a source independent of the subassembly.

The active vibration control subassembly of the invention is for a structure having first and second generally opposing sides, wherein the structure undergoes bending vibrations caused by a source independent of the subassembly. The subassembly includes a first piezoceramic actuator plate. The first plate is vibratable by a first applied electric AC signal, and the first plate is connected to the first side of the structure such that vibrations in the first plate cause bending vibrations in the structure and such that the first plate is compressively prestressed along the structure when the structure is free of the bending vibrations. The first AC signal is controllable such that bending vibrations in the structure caused by vibrations in the first plate induced by the first AC signal are generally opposite in phase to bending vibrations in the structure caused by the source.

In a preferred embodiment, the first plate is compressively prestressed along the structure to a value not exceeding (and preferably equal to) generally half the absolute value of the first plate's critical compressive stress minus half the absolute value of the first plate's critical tensile stress.

Several benefits and advantages are derived from the invention. The compressively prestressed first piezoceramic actuator plate can be driven by a larger-amplitude applied electric AC signal than can a non-prestressed first piezoceramic actuator plate. Thus, with the invention, larger canceling bending vibrations can be produced by the structure.

BRIEF DESCRIPTION OF THE DRAWINGS

The accompanying drawings illustrate a preferred embodiment of the present invention wherein.

DETAILED DESCRIPTION OF THE INVENTION

Figure 1:
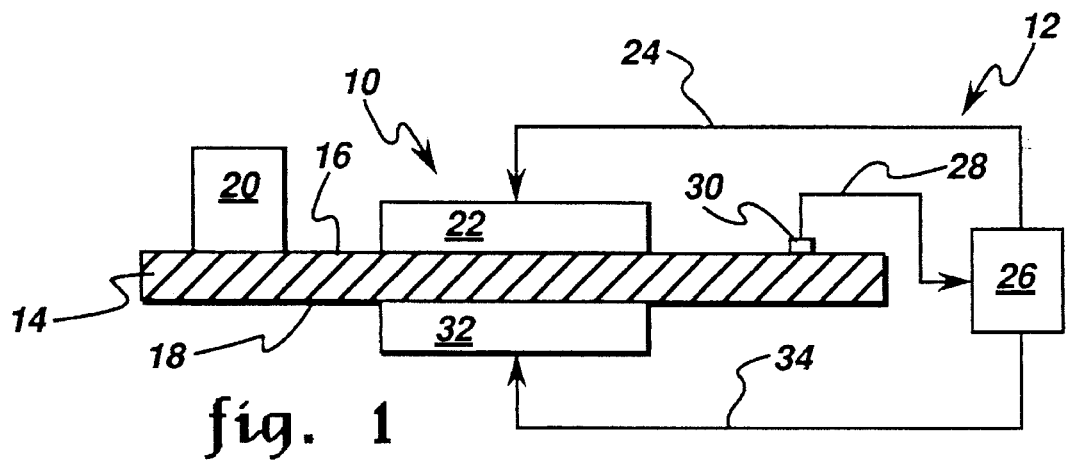
FIG. 1 is a schematic side-elevational, cross-sectional view of a structure and an active vibration control system including the active vibration control subassembly of the invention.

Referring now to the drawings, wherein like numerals represent like elements throughout, FIGS. 1–4 show the active vibration control subassembly 10 of the present invention. The active vibration control subassembly 10, which is part of an active vibration control system 12, is for a structure 14 having first and second generally opposing sides 16 and 18. The structure 14 undergoes bending vibrations caused by a source 20 independent of the subassembly 10. For example, the source 20 is the clothes agitator when the structure 14 is a side panel of a household washing machine. The structure 14 may be any other structure which undergoes bending vibrations such as, but not limited to, annularly-cylindrical superconductive coils in magnetic resonance imaging (MRI) superconducting magnets, patient positioning tables in X-ray machines, and ducts in aircraft engines.

The active vibration control subassembly 10 includes a first piezoceramic actuator plate 22 which is vibratable by a first applied electric AC signal 24 generated by a controller 26. The first piezoceramic actuator plate 22 is connected to the first side 16 of the structure 14 such that vibrations in the first plate 22 induced by the first AC signal 24 cause bending vibrations in the structure 14 and such that the first plate 22 is compressively prestressed along the structure 14 when the structure 14 is free of any bending vibrations. The first applied electric AC signal 24 generated by the controller 26 is controllable such that bending vibrations in the structure 14 caused by vibrations in the first plate 22 induced by the first AC signal 24 are canceling vibrations in that they are generally opposite in phase to bending vibrations in the structure 14 caused by the source 20. In an exemplary embodiment, such canceling bending vibrations calculated by the controller 26 are calculated from a signal 28 of motion of the structure 14 sensed by an accelerometer 30 (or a strain gauge, or the like) attached to the first side 16 of the structure 14. The controller 26 may be a digital or analog computer or other control device, as is known to those skilled in the art. It is noted that the active vibration control system 12 includes the active vibration control subassembly 10, the accelerometer 30, and the controller 26.

For purposes of describing the invention, the term "piezoceramic" refers to a material which exhibits a piezoelectric effect and is not limited to commonly called piezoceramic materials but also includes electrostrictive materials while excluding magnetostrictive materials. Typically, the first piezoceramic actuator plate 22 is a sheet (e.g., 50×50×0.25 millimeters) of piezoceramic material bonded to the flat or curved structure 14 using an epoxy or alkyl cyanolate compound. Vacuum pads or weights are sometimes used during the bonding process to apply a uniform pressure on the first plate 22, especially when bonding the plate to a curved structure surface. A preferred method for creating the compressive prestress of the first plate 22 is to create the compressive stress during the bonding process as follows: 1) bend the edges of the structure 14 away from the first piezoceramic actuator plate 22 (as in FIG. 4) so the shape of the deformation follows the mode shape to be excited; 2) bond the first plate 22 to the structure 14; and 3) release the structure 14 so the structure 14 goes back to its original shape with the first plate 22 now having an applied compressive prestress. The structure 14 can be bendably deformed over a molding tool (not shown) having a face which follows the mode shape of interest. The molding tool face may have holes allowing a vacuum to be drawn to bendably deform and hold the structure 14 onto the molding tool face. Instead of using a molding tool, the structure 14 can be bendably deformed over the front surface of a molding plate (not shown). The back surface of the molding plate may be enclosed in a sealed chamber which is pressurized with gas so the molding plate follows the mode shape of interest. Another preferred method for creating the compressive prestress is to heat the structure 14, then bond the first plate 22 to the heated structure, and then allow the structure 14 to cool to room temperature which will give the connected first plate 22 an applied compressive prestress as long as the thermal expansion coefficient of the structure 14 is greater than that of the first plate 22.

In an exemplary embodiment, the active vibration control subassembly 10 further includes a second piezoceramic actuator plate 32 which is vibratable by a second applied electric AC signal 34 generated by the controller 26. The second piezoceramic actuator plate 32 is connected to the second side 18 of the structure 14 such that vibrations in the second plate 32 induced by the second AC signal 34 cause bending vibrations in the structure 14 and such that the second plate 32 is compressively prestressed along the structure 14 when the structure 14 is free of any bending vibrations. The second applied electric AC signal 34 generated by the controller 26 is controllable such that bending vibrations in the structure 14 caused by vibrations in the second plate 32 induced by the second AC signal 34 are canceling vibrations in that they are generally opposite in phase to bending vibrations in the structure 14 caused by the source 20. It is noted that the first and second piezoceramic actuator plates 22 and 32 are powered "out-of-phase" so that, for example, the first plate 22 expands while the second plate 32 contracts. When two piezoceramic actuator plates 22 and 32 are used, it is preferred that their combined effect results in causing bending vibrations in the structure 14 which are generally equal in amplitude to bending vibrations in the structure 14 caused by the source 20. It is also preferred that when only one piezoceramic actuator plate 22 or 32 is used, its effect results in causing bending vibrations in the structure 14 which are generally equal in amplitude to bending vibrations in the structure 14 caused by the source 20.

Preferably, the first plate 22 and the second plate 32 are each compressively prestressed along the structure 14 to a value of at least generally 100 Newton-square meters. As with all piezoceramic materials, the first and second piezoceramic actuator plates 22 and 32 each have a critical compressive stress and a critical tensile stress, wherein the absolute value of the critical compressive stress of each plate 22 and 32 is greater than the absolute value of its critical tensile stress. In an exemplary embodiment, each plate 22 and 32 is compressively prestressed along the structure 14 to a value not exceeding (and preferably equal to) generally half the absolute value of its critical compressive stress minus half the absolute value of its critical tensile stress. The benefit of compressive prestressing may be seen by way of the following example. For purposes of illustration only, assume that a typical piezoceramic actuator plate has a critical compressive stress of +11 units and a critical tensile stress of −1 units. Without the compressive prestress of the present invention, the first piezoceramic actuator plate 22 could vibrate in compression and tension with an amplitude of only 1 unit between +1 and −1 units which would result in modest canceling bending vibrations in the structure 14. Driving the first plate 22 to larger vibrations in compression and tension would destroy the first plate 22 once its critical tensile stress of −1 units were exceeded. With the preferred compressive prestress of +5 units, the first piezoceramic actuator plate 22 can vibrate in compression and tension with an amplitude of 6 units about the +5 unit compressive prestress level which would result in larger canceling bending vibrations in the structure 14. It is noted that compressive prestressing to a value less than generally 100 Newton-square meters would have no appreciable benefit, as can be appreciated by those skilled in the art.

Figure 2:
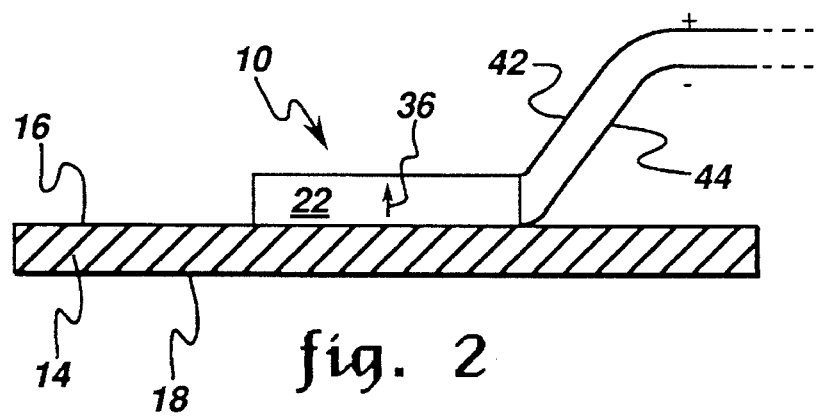
FIG. 2 is an enlarged view of the subassembly and structure of FIG. 1 showing a non-vibrating structure.
Figure 3:
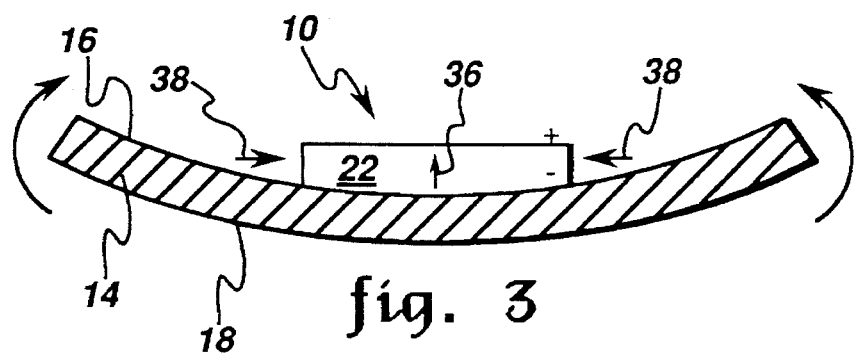
FIG. 3 is a view of the subassembly and structure of FIG. 2 showing a bendably vibrating structure displaced in a first direction.
Figure 4:
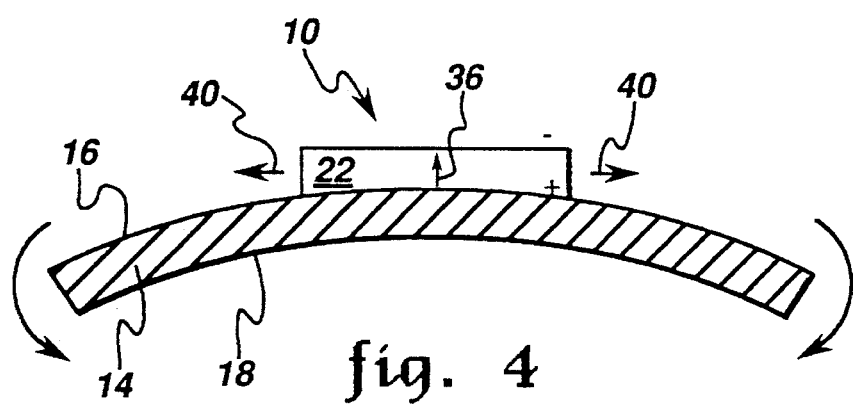
FIG. 4 is a view of the subassembly and structure of FIG. 2 showing a bendably vibrating structure displaced in the opposite direction.

As with all piezoceramic materials, the first piezoceramic actuator plate 22 has a poling direction 36 seen in FIG. 2. In FIGS. 2–4, the second plate 32 has been omitted for clarity. The poling direction 36 represents the "electrical" axis of the material. As seen in FIG. 3, an electric field (represented by the lower "−" symbol and the upper "+" symbol) applied in the poling direction 36 causes contraction (i.e., compression) of the first plate 22 along arrows 38. As seen in FIG. 4, an electric field (represented by the upper "−" symbol and the lower "+" symbol) applied opposite to the poling direction 36 causes expansion (i.e., tension) of the first plate 22 along arrows 40. Unnumbered arrows indicate the direction of bending in the structure 14 caused by the contraction and expansion in the first plate 22.

In a preferred embodiment, as seen in FIG. 2, the first plate 22 has a positive electric DC bias in the poling direction 36 (indicated by the "−" symbol near wire 44 and the "+" symbol near wire 42, with the wires 42 and 44 being attached to the first plate 22). Preferably, the positive electric DC bias in the poling direction 36 has a value of at least generally 5 volts. All piezoceramic materials have a first depolarization voltage in the poling direction 36 and a second depolarization voltage in a direction generally opposite to the poling direction, wherein the absolute value of the first depolarization voltage is greater than the absolute value of the second depolarization voltage. A piezoceramic material will not contract beyond its first depolarization voltage and will not expand beyond its second depolarization voltage. In an exemplary embodiment, the positive electric DC bias in the poling direction 36 has a value not exceeding (and preferably equal to) generally half the absolute value of the first depolarization voltage minus half the absolute value of the second depolarization voltage.

As can be appreciated by those skilled in the art, the effects and benefits of applying a positive electric DC bias in the poling direction 36 to the first piezoceramic actuator plate 22 are similar to the benefits of applying a compressive prestress to the first plate 22. Basically, the added positive electric DC bias in the poling direction 36 shifts the first applied electric AC signal 24 away from the limiting second depolarization voltage which allows the first AC signal 24 to have a larger amplitude resulting in a larger amplitude of bending vibrations in the structure 14. It is noted that a positive electric DC bias in the poling direction 36 can be applied equally well to the second piezoceramic actuator plate 32. Preferably, a positive electric DC bias in the poling direction 36 should only be applied to a compressively prestressed piezoceramic actuator plate, as can be understood by those skilled in the art from an appreciation of the present invention.

The foregoing description of a preferred embodiment of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

We claim:

1. An active vibration control subassembly for a structure having first and second generally opposing sides, said structure undergoing bending vibrations caused by a source independent of said subassembly, and said subassembly comprising a first piezoceramic actuator plate vibratable by a first applied electric AC signal, said first plate connected to said first side of said structure such that vibrations in said first plate induced by said first AC signal cause bending vibrations in said structure and such that said first plate is compressively prestressed along said structure when said structure is free of any bending vibrations, and wherein said first AC signal is controllable such that bending vibrations in said structure caused by vibrations in said first plate induced by said first AC signal are generally opposite in phase to bending vibrations in said structure caused by said source.

2. The subassembly of claim 1, wherein said first plate is compressively pre-stressed along said structure to a value of at least generally 100 Newton-square meters.

3. The subassembly of claim 2, wherein said first plate has a critical compressive stress and a critical tensile stress, wherein the absolute value of said critical compressive stress is greater than the absolute value of said critical tensile stress, and wherein said first plate is compressively pre-stressed along said structure to a value not exceeding generally half the absolute value of said critical compressive stress minus half the absolute value of said critical tensile stress.

4. The subassembly of claim 3, wherein said first plate is compressively pre-stressed along said structure to a value generally equal to half the absolute value of said critical compressive stress minus half the absolute value of said critical tensile stress.

5. The subassembly of claim 1, also including a second piezoceramic actuator plate vibratable by a second applied electric AC signal, said second plate connected to said second side of said structure such that vibrations in said second plate induced by said second AC signal cause bending vibrations in said structure and such that said second plate is compressively pre-stressed along said structure when said structure is free of any bending vibrations, and wherein said second AC signal is controllable such that bending vibrations in said structure caused by vibrations in said second plate induced by said second AC signal are generally opposite in phase to bending vibrations in said structure caused by said source.

6. The subassembly of claim 5, wherein said second plate is compressively pre-stressed along said structure to a value of at least generally 100 Newton-square meters.

7. The subassembly of claim 1, wherein said first plate has a poling direction and a positive electric DC bias in said poling direction.

8. The subassembly of claim 7, wherein said positive electric DC bias has a value of at least generally 5 volts.

9. The subassembly of claim 8, wherein said first plate has a first depolarization voltage in said poling direction and a second depolarization voltage in a direction generally opposite to said poling direction, wherein the absolute value of said first depolarization voltage is greater than the absolute value of said second depolarization voltage, and wherein said positive electric DC bias has a value not exceeding generally half the absolute value of said first depolarization voltage minus half the absolute value of said second depolarization voltage.

10. The subassembly of claim 9, wherein said positive electric DC bias has a value generally equal to half the absolute value of said first depolarization voltage minus half the absolute value of said second depolarization voltage.

\* \* \* \* \*